United States Patent
LoBianco et al.

(10) Patent No.: US 12,261,127 B2
(45) Date of Patent: Mar. 25, 2025

(54) APPLICATION OF CONDUCTIVE VIA OR TRENCH FOR INTRA MODULE EMI SHIELDING

(71) Applicant: SKYWORKS SOLUTIONS, INC., Irvine, CA (US)

(72) Inventors: Anthony James LoBianco, Irvine, CA (US); Hoang Mong Nguyen, Fountain Valley, CA (US); Matthew Sean Read, Foothill Ranch, CA (US); Howard E. Chen, Anaheim, CA (US); Ki Wook Lee, Irvine, CA (US); Yi Liu, San Diego, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 314 days.

(21) Appl. No.: 17/655,801

(22) Filed: Mar. 22, 2022

(65) Prior Publication Data
US 2022/0310530 A1     Sep. 29, 2022

Related U.S. Application Data

(60) Provisional application No. 63/164,763, filed on Mar. 23, 2021.

(51) Int. Cl.
*H01L 23/552*     (2006.01)
*H01L 21/48*      (2006.01)
(Continued)

(52) U.S. Cl.
CPC ........ *H01L 23/552* (2013.01); *H01L 21/4814* (2013.01); *H01L 21/565* (2013.01);
(Continued)

(58) Field of Classification Search
None
See application file for complete search history.

(56) References Cited

U.S. PATENT DOCUMENTS

| 8,071,431 B2 | 12/2011 | Hoang et al. |
| 8,373,264 B2 | 2/2013 | Welch et al. |

(Continued)

FOREIGN PATENT DOCUMENTS

WO     2010014103 A1     2/2010

OTHER PUBLICATIONS

Written Opinion from corresponding Singaporean Application No. 10202202911V dated Aug. 9, 2023.
(Continued)

*Primary Examiner* — Long Pham
(74) *Attorney, Agent, or Firm* — Lando & Anastasi, LLP

(57) ABSTRACT

A packaged semiconductor module comprises a substrate having a ground plane, an electronic device mounted on a surface of the substrate, a bond pad disposed on the surface of the substrate and electrically connected to the ground plane, a mold compound covering the electronic device, a conductive post disposed on a side of the electronic device, the conductive post extending from the bond pad and at least partially through the mold compound, and a conductive layer disposed on the mold compound and electrically coupled to the conductive post and to the ground plane, the conductive post, the conductive layer, and the ground plane together forming the integrated electromagnetic interference shield, the conductive post extending from the bond pad to the conductive layer in a direction perpendicular to a plane defined by the surface of the substrate.

12 Claims, 5 Drawing Sheets

(51) Int. Cl.
*H01L 21/56* (2006.01)
*H01L 23/31* (2006.01)
*H01L 23/498* (2006.01)
*H01L 25/00* (2006.01)
*H01L 25/065* (2023.01)
*H01L 23/00* (2006.01)

(52) U.S. Cl.
CPC .... *H01L 23/3121* (2013.01); *H01L 23/49827* (2013.01); *H01L 25/0655* (2013.01); *H01L 25/50* (2013.01); *H01L 24/48* (2013.01); *H01L 2224/48227* (2013.01)

(56) References Cited

U.S. PATENT DOCUMENTS

| | | | |
|---|---|---|---|
| 8,399,972 B2 | 3/2013 | Hoang et al. | |
| 8,948,712 B2 | 2/2015 | Chen et al. | |
| 8,987,788 B2 * | 3/2015 | McCarten | H01L 27/14843 257/E27.159 |
| 9,041,168 B2 | 5/2015 | Hoang et al. | |
| 9,054,115 B2 | 6/2015 | Hoang et al. | |
| 9,071,335 B2 | 6/2015 | Agarwal et al. | |
| 9,202,747 B2 | 12/2015 | Chen et al. | |
| 9,203,529 B2 | 12/2015 | Chen et al. | |
| 9,214,387 B2 | 12/2015 | Chen et al. | |
| 9,252,107 B2 | 2/2016 | Read et al. | |
| 9,295,157 B2 | 3/2016 | Chen et al. | |
| 9,381,529 B2 | 7/2016 | Read | |
| 9,419,667 B2 | 8/2016 | Lobianco et al. | |
| 9,515,029 B2 | 12/2016 | Chen et al. | |
| 9,555,425 B2 | 1/2017 | Read | |
| 9,627,352 B2 | 4/2017 | Read | |
| 9,646,936 B2 | 5/2017 | Chen et al. | |
| 9,653,409 B2 | 5/2017 | Read et al. | |
| 9,703,913 B2 | 7/2017 | Chen et al. | |
| 9,754,896 B2 | 9/2017 | Read et al. | |
| 9,761,537 B2 | 9/2017 | Chen et al. | |
| 9,871,599 B2 | 1/2018 | Chen et al. | |
| 10,061,885 B2 | 8/2018 | Chen et al. | |
| 10,163,814 B2 | 12/2018 | Read et al. | |
| 10,200,077 B2 | 2/2019 | Liu et al. | |
| 10,242,143 B2 | 3/2019 | Chen et al. | |
| 10,290,585 B2 | 5/2019 | Nguyen et al. | |
| 10,446,503 B2 | 10/2019 | Chen et al. | |
| 10,524,350 B2 | 12/2019 | Lobianco et al. | |
| 10,529,669 B2 | 1/2020 | Nguyen et al. | |
| 10,579,766 B2 | 3/2020 | Chen et al. | |
| 10,580,741 B2 | 3/2020 | Read et al. | |
| 10,586,010 B2 | 3/2020 | Chen et al. | |
| 10,615,841 B2 | 4/2020 | Liu et al. | |
| 10,797,002 B2 | 10/2020 | Nguyen et al. | |
| 11,610,847 B2 * | 3/2023 | Kim | H01L 23/31 |
| 11,862,572 B2 * | 1/2024 | Kim | H01L 23/552 |
| 2010/0140759 A1 * | 6/2010 | Pagaila | H01L 24/73 257/E23.116 |
| 2014/0252595 A1 | 9/2014 | Yen et al. | |
| 2018/0374798 A1 | 12/2018 | Lee et al. | |
| 2021/0217725 A1 * | 7/2021 | Kim | H01L 23/552 |
| 2024/0088059 A1 * | 3/2024 | Lee | H01L 24/16 |
| 2024/0113038 A1 * | 4/2024 | Kim | H01L 23/31 |

OTHER PUBLICATIONS

Combined Search and Examination Report from corresponding United Kingdom Application No. 2203827.7 dated Aug. 5, 2022.

* cited by examiner

APPLICATION OF CONDUCTIVE VIA OR TRENCH FOR INTRA MODULE EMI SHIELDING

CROSS-REFERENCE TO RELATED APPLICATIONS

This application claims priority under 35 U.S.C. § 119(e) to U.S. Provisional Patent Application Ser. No. 63/164,763, titled "APPLICATION OF CONDUCTIVE VIA OR TRENCH FOR INTRA MODULE EMI SHIELDING," filed Mar. 23, 2021, the entire contents of which is incorporated herein by reference for all purposes.

BACKGROUND

Technical Field

The present invention is directed to semiconductor device packages and, more particularly, to electromagnetic and/or radio frequency interference shielding for semiconductor devices.

Description of Related Technology

There exists a general desire in radio frequency (RF) communication systems for RF devices to be isolated from electromagnetic (radio frequency) interference (EMI) generated by other RF devices to maintain proper device performance. Similarly, the RF devices generally should be isolated from the electromagnetic interference received from, or transmitted to, the environment.

The traditional method of isolating RF devices from such electromagnetic interference is to cover the RF device with a grounded metal enclosure typically called a "can." However, this solution is costly and lacks design flexibility. In addition, the metal can add significant size to the device footprint on a printed circuit board, and also adds weight to the printed circuit board.

SUMMARY

In accordance with one aspect, there is provided a packaged semiconductor module having an integrated electromagnetic interference. The packaged semiconductor module comprises a substrate having a ground plane, an electronic device mounted on a surface of the substrate, a bond pad disposed on the surface of the substrate and electrically connected to the ground plane, a mold compound covering the electronic device, a conductive post disposed on a side of the electronic device, the conductive post extending from the bond pad and at least partially through the mold compound, and a conductive layer disposed on the mold compound and electrically coupled to the conductive post and to the ground plane, the conductive post, the conductive layer, and the ground plane together forming the integrated electromagnetic interference shield, the conductive post extending from the bond pad to the conductive layer in a direction perpendicular to a plane defined by the surface of the substrate.

In some embodiments, the conductive layer is disposed on a top and sides of the mold compound.

In some embodiments, the conductive layer physically contacts the ground plane on a side of the mold compound.

In some embodiments, the conductive layer physically contacts the conductive post on the top of the mold compound.

In some embodiments, the conductive layer includes silver-filled epoxy.

In some embodiments, the electronic device is an RF device.

In some embodiments, the packaged semiconductor module further comprises a plurality of electronic devices mounted on the surface of the substrate and a plurality of conductive posts disposed between two of the plurality of electronic devices.

In some embodiments, the packaged semiconductor module further comprises a plurality of electronic devices mounted on the surface of the substrate and only a single conductive post disposed between two of the plurality of electronic devices.

In some embodiments, the packaged semiconductor module further comprises a plurality of conductive posts surrounding the electronic device.

In some embodiments, the packaged semiconductor module further comprises a conductive via disposed within the substrate and providing electrical connection between the bond pad and the ground plane.

In some embodiments, the conductive via is disposed directly below the conductive post.

In some embodiments, the conductive via is laterally displaced from the conductive post.

In accordance with another aspect, there is provided a method of forming a packaged semiconductor module having an integrated electromagnetic interference shield. The method comprises providing a substrate having a ground plane, mounting an electronic device on a surface of the substrate, forming a bond pad on the surface of the substrate and electrically connected to the ground plane, depositing a mold compound on the electronic device, ablating a via opening in the mold compound on a side of the electronic device, ablating the via opening exposing an upper side of the bond pad, forming a conductive post within the via opening and in electrical contact with the bond pad, and depositing a conductive layer on the mold compound and in physical contact with the conductive post and with the ground plane, the conductive post, the conductive layer, and the ground plane together forming the integrated electromagnetic interference shield, the conductive post extending from the bond pad to the conductive layer in a direction perpendicular to a plane defined by the surface of the substrate.

In some embodiments, forming the conductive post within the via opening includes depositing a solder paste within the via opening.

In some embodiments, forming the conductive post within the via opening includes forming the conductive post by electroplating.

In some embodiments, forming the conductive post within the via opening includes forming the conductive post by physical vapor deposition.

In some embodiments, the method further comprises mounting a plurality of electronic devices on the surface of the substrate.

In some embodiments, forming the conductive post incudes forming a plurality of conductive posts between two of the plurality of electronic devices.

In some embodiments, depositing the conductive layer on the mold compound includes depositing the conductive layer on a top and on sides of the mold compound. In some embodiments, depositing the conductive layer on the mold compound includes depositing the conductive layer in physical contact with the ground plane on a side of the mold compound.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
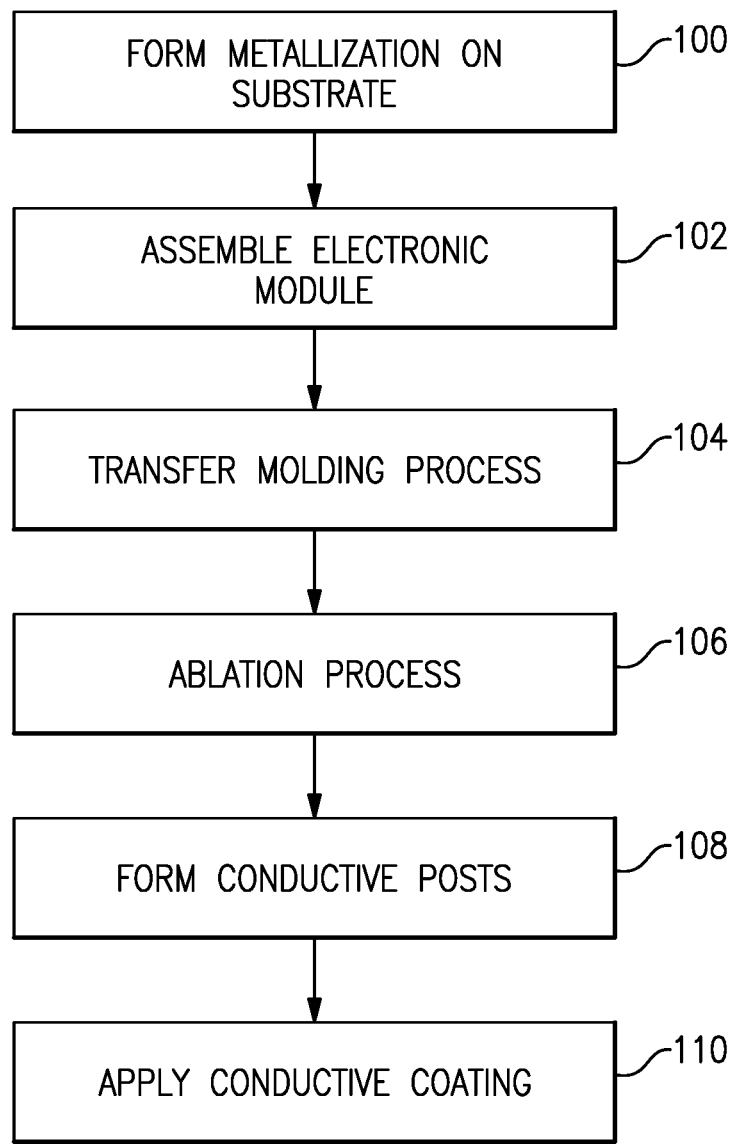
FIG. 1 is a flow diagram illustrating one example of a method of providing an integrated EMI shield as part of a packaging process.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Aspects and embodiments disclosed herein are directed to a semiconductor device module, and methods of making the same, that integrate an electromagnetic interference (EMI) shield into the device module. In one embodiment, one or more conductive posts are positioned on one or more sides of one or more devices within the module and are coupled to conductive layers above and below the one or more devices, thereby forming an EMI shield around the one or more devices. The EMI shield reduces or eliminates degradation in performance of the one or more devices within the module due to EMI received from one or more other devices in the module or from the environment.

One aspect is directed to a packaged semiconductor module having an integrated electromagnetic interference shield. In one embodiment, the packaged semiconductor module comprises a substrate having a ground plane, a plurality of electronic devices mounted on a surface of the substrate, at least one conductive post disposed on at least one side of at least one of the electronic devices and electrically coupled to the ground plane, a mold compound covering the electronic devices and at least partially covering the at least one conductive post, and a conductive layer disposed on a top surface of the mold compound and electrically coupled to the at least one conductive post, wherein the at least one conductive post, the conductive layer, and the ground plane together comprise the integrated electromagnetic interference shield.

In one example, the conductive layer comprises silver-filled epoxy. The at least one conductive post can be made from various conductive materials, such as gold, copper, solder, conductive paint, doped polysilicon, or silver-filled epoxy. The at least one conductive post may be disposed between two of the plurality of electronic devices in the semiconductor module. In one example, the plurality of electronic devices are radio frequency (RF) devices.

Another aspect is directed to a method of manufacturing a module having an integrated electromagnetic interference shield. According to one embodiment, the method comprises connecting a plurality of electronic devices to a substrate including a ground plane, providing bond pads on the substrate electrically connected to the ground plane, performing a molding process to encapsulate the plurality of electronic devices in mold compound, forming one or more conductive posts in the mold compound between adjacent ones of the plurality of electronic devices and in electrical connection with the bond pads, and disposing a conductive layer on a surface of the mold compound, the conductive layer electrically connected to the one or more conductive posts. In one example, the method further comprises ablating the surface of the mold compound, prior to disposing the conductive layer on the surface of the mold compound, to form via holes for the one or more conductive posts. The one or more conductive posts may be formed in the vias by screen printing of solder paste, electroplating, chemical vapor deposition, physical vapor deposition (evaporative deposition or sputtering), by deposition of conductive paint, or by other methods of depositing conductive material known in the art. In some examples, disposing the conductive layer on the surface of the mold compound includes painting a layer of silver-filled epoxy or conductive paint on the top and side surfaces of the mold compound.

In many modern applications, including cellular phone handsets, personal digital assistants (PDAs), media players, and other portable device that use radio frequency (RF) components, the size (length, width and thickness) and weight of the finished product can often be important design parameters. For example, particularly for cellular phone handsets, there is continuing drive toward devices that offer increased functionality and features within a given form factor. Accordingly, the size and weight of individual components used in these devices can also be important. As discussed above, the conventional approach for providing electromagnetic interference shielding for RF devices involves placing a grounded metal can over the individual RF device to be shielded, which adds size, weight and cost to the design and therefore, may be undesirable in many instances.

Aspects and embodiments disclosed herein are directed to methods and apparatuses to provide an interference shield that is integrated into individual modules during the packaging process with minimal increase in the size and/or weight of the module. As used herein, the term "EMI shield" is used to refer to both electromagnetic interference and radio frequency interference shielding. Aspects and embodiments of methods and structures for proving EMI protection for devices in an electronics device module may provide high design flexibility as well as an easier and less expensive method by which to manufacture EMI shields. In addition, an integrated "fencepost" shield according to aspects of the invention provides a way to achieve inter/intra module isolation and low package profile, which has not been achieved by conventional existing technologies. As discussed below, a fencepost cage may be formed using conductive columns disposed between or around one or more electronic devices in a module to provide a robust and practical EMI shield for various packages and process conditions.

Referring to FIG. 1, there is illustrated one example of a method of packaging an electronic device or module incorporating an integrated EMI shield. Aspects and embodiments of the method are discussed below with continuing reference to FIG. 1.

A first step 100 includes preparing a substrate to be incorporated into an electronic module. This step 100 may include forming metallization on the substrate that may be used to interconnect various components of the electronic module and at least some of which may become part of the integrated EMI shield, as discussed further below. In step 102, an electronic module may be assembled according to methods and techniques known to those skilled in the art. This step 102 may include acts such as mounting a plurality of die to the substrate, forming any necessary internal or external connections or connection points (including depositing layers of metallization and/or dielectric), etc. Therefore, it is to be appreciated that although module assembly is illustrated as a single step 102 in FIG. 1, it may comprise several steps that may be performed at the same time, at different times, and/or in different locations. Furthermore, it is to be appreciated that step 100 may be considered part of step 102.

Figure 2:
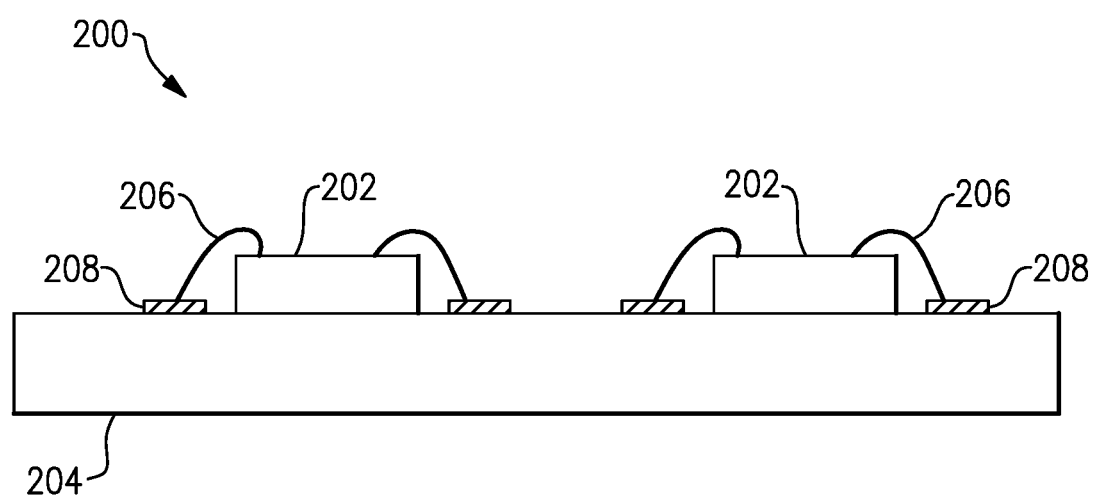
FIG. 2 is a diagram of one example of an electronic module comprising a substrate and one or more dies mounted thereto.

An example of such a module is illustrated in FIG. 2. The module 200 comprises at least two die 202 mounted to a substrate 204. Some examples of the die 202 include, but are not limited to, power amplifiers, low noise amplifiers, transceivers, linear devices, filters and other devices that may require or benefit from EMI shielding. As discussed above, EMI shielding is typically desirable for RF devices and therefore, at least one of the die 202 may be an RF device and the module 200 may be an RF module; however, it is to be appreciated that the invention is not so limited, and the die 202 may comprise any type of digital or analog device or component. In one example, the die 202 are mounted to the substrate 204 using wire bonds 206 connected to bond pads 208, as illustrated in FIG. 2. Alternatively, the die 202 may be mounted to the substrate 204 using flip chip bonding methods, or any other suitable technique known to those skilled in the art.

According to one embodiment, an integrated EMI shield is incorporated into the module 200 by forming one or more conductive posts 216 on one or more sides of one or more of the die 202, for example, between adjacent die 202 during the packaging process. A plurality of these conducive posts 216 may be placed around the die 202 on the substrate 204 and connected to a ground plane 212 in the package, as discussed further below, to provide the integrated EMI shield. To form an integrated shield in a molded module, a manufacturing difficulty lies in finding a way to connect the ground plane 212 in the substrate to the top conductive shield layer. Embodiments of the methods of forming an integrated shield using conductive post connectors 216 provide a robust manufacturing process for resolving this difficulty, as discussed further below.

Figure 3:
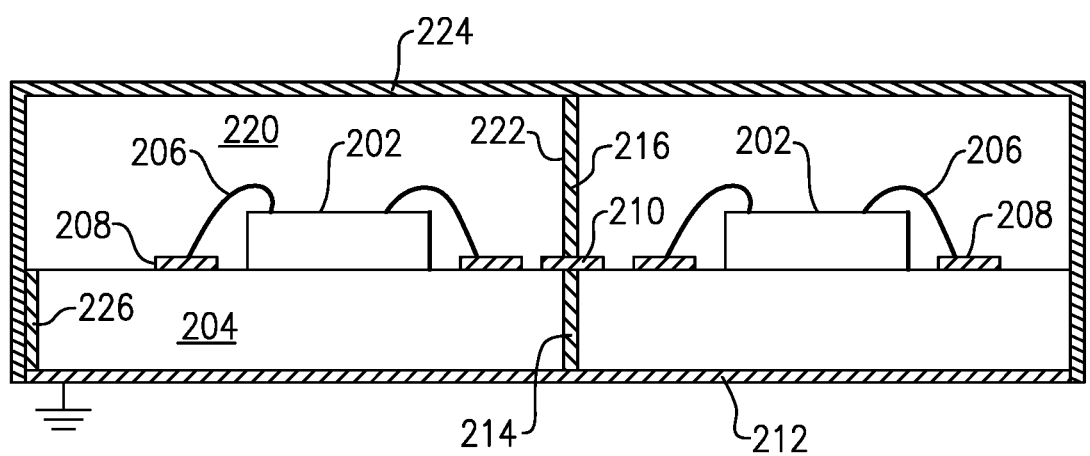
FIG. 3 is a diagram of one example of a device package incorporating an integrated EMI shield.
Figure 4:
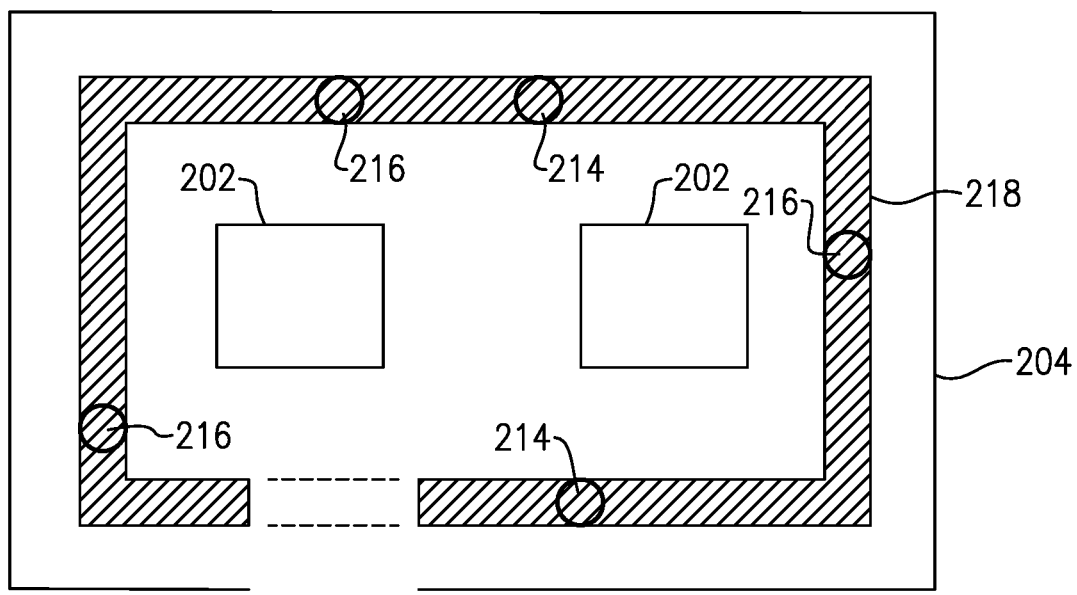
FIG. 4 is a plan view of a portion of a device package including a continuous wirebond track.

Referring again to FIG. 1, as discussed above, step 100 may include forming metallization on the substrate 204 that will become part of the integrated EMI shield. Referring to FIG. 3, this metallization may include bond pads 210, a ground plane 212, and vias 214 that connect the bond pads to the ground plane 212. Conductive posts 216 may then be formed on the bond pads 210 (step 108), as discussed further below. It is to be appreciated that although in the example illustrated in FIG. 3, one discrete bond pad 210, with associated via 214, is provided for the conductive post 216, aspects and embodiments disclosed herein are not so limited and many other configurations are contemplated. For example, as illustrated in FIG. 4, the individual bond pads 210 may be replaced with a metallization track or ring 218 that may at least partially encircle the die(s) 202. In this example, one or more vias 214 may be provided at points along the track 218 to couple the track, and therefore the conductive posts 216, to the ground plane 212. Furthermore, in one example, the track 218 may be continuous between two or more conductive posts 216 and therefore, each conductive post 216 need not have an individually associated via 214 and the vias 214 may be laterally offset from the conductive posts.

According to one embodiment, the method of forming an integrated EMI shield includes a transfer molding process (step 104) to encapsulate the die(s) 202 in a mold compound 220. During the transfer molding process the substrate 204 is placed in a lower mold chase, an upper mold chase is lowered onto the lower mold chase to a seal a cavity around the device, and the mold compound 220 is flowed into the cavity to encapsulate the die(s) 202 on the substrate. Transfer molding processes are well known to those skilled in the art.

Still referring to FIGS. 1 and 3, after the transfer molding process (step 104), an ablation process (step 106) may be used to form via holes 222 for the conductive posts 216 through the mold compound 220. The ablation process may include, for example, a laser ablation process, an anisotropic etch process, a drilling process utilizing mechanical drill bits, micro ablation (sand blasting), or other methods of forming a via through the mold compound known in the art. The ablation process exposes upper portions of the bond pads 210 on which the conductive posts 216 will be formed. The bond pads 210 may serve as etch stops or ablation stops during the ablation process. The via holes 222 may be about 100 μm wide to facilitate later filling with conductive material.

After formation of the vias holes 222, the conductive posts 216 are formed within the via holes 222 and in electrical contact with the bond pads 210 and the ground plane 212 (step 108). The conductive posts 216 may be formed by, for example, screen printing of solder paste, electroplating, chemical vapor deposition, physical vapor deposition (evaporative deposition or sputtering), by deposition of conductive paint, or by other methods of depositing conductive material known in the art. The conductive posts 216 may be formed of or include copper, gold, silver, solder, doped polysilicon, or any other suitable conductive material. The conductive posts 216 may extend from the bond pads 210 to the upper surface of the molding compound 220 and the upper ends of the via holes 222, but in other embodiments may have upper ends disposed below the upper surface of the molding compound 220 and the upper ends of the via holes 222.

After the conductive posts 216 have been formed, a thin conductive coating or layer 224 may be formed on top of the mold compound 220 (step 110) to contact the exposed tops of the conductive posts 216. The conductive layer 224 may be deposited on top of the mold compound 220 using any of various techniques known to those skilled in the art, such as, by printing, depositing, sputtering, etc. In one example, the conductive layer 224 comprises a metal-filled epoxy, such as a silver-filled epoxy, or a metal paint layer as disclosed in U.S. Pat. No. 10,163,814, incorporated herein by reference, that is spray-painted on top of the mold compound 220. The conductive layer 224 contacts the exposed tops of the conductive posts 216 and thus electrically connects the exposed conductive posts 216. The conductive layer 224 may also cover sides of the mold compound 210 and extend down to exposed positions of the ground plane 212 or to a conductive material layer 226 previously formed on sides of the mold compound 210 (for example, in step 100) and in electrical connection with the ground plane 212. The conductive posts 216 may thus be in electrical connection to the ground plane 212 both from the bottom ends through the bond pads 210 and vias 214, and from top ends through the conductive layer 224 and, optionally, conductive material layer 226.

As discussed above, in one embodiment, the module 200 includes a ground plane 212 disposed along a bottom surface of the substrate 204, as shown in FIG. 3, and connected to the conductive posts 216 by vias 214. Through contact between the tops of the conductive posts 216 and the conductive layer 224, an electrical connection is formed between the conductive layer and the ground plane 212, thus completing an EMI shield in the module 200. The conductive posts 216 provide a flexible (because they may be located anywhere suitable on the substrate) and fully integrated connection between the ground plane 212 in the substrate 204 and the top conductive shield layer 224. Thus, one or more of the die(s) 202 may be substantially enclosed in a grounded EMI shield formed by the conductive layer 224, the conductive posts 216 (and their associated metallizations, such as vias 214 and bond pads 210) and the ground plane 212. This integrated EMI shield according to embodiments of the invention may add minimal size and weight to the module 200, unlike the bulky metal cans of conventional EMI shielding solutions.

Figure 5:
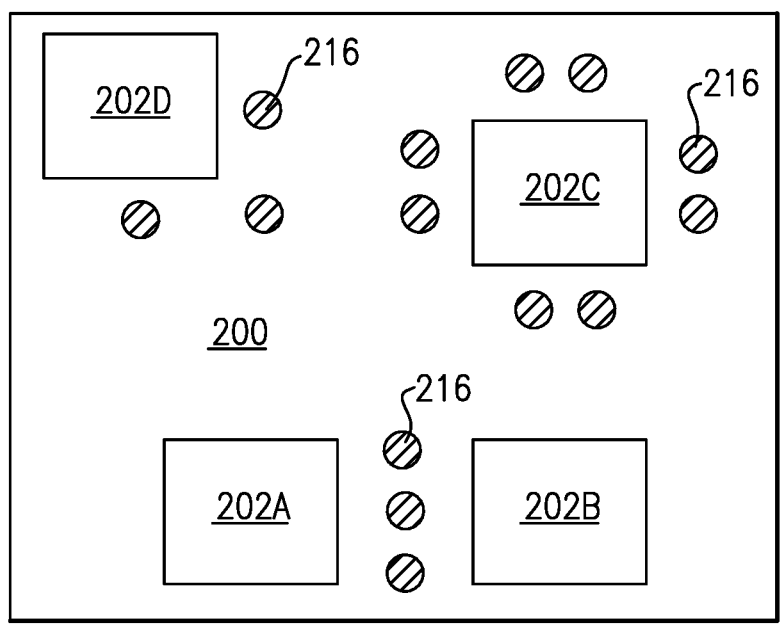
FIG. 5 is a plan view of an example of an electronic module illustrating relative placements of devices or die and conductive posts.

The locations of the conductive posts 216 and associated bond pads 210 and vias 214 may be selected to minimize the number of conductive posts 216 utilized to minimize associated fabrications costs, while providing sufficient intra-module EMI protection between devices or die 202 in a module to meet specifications. For example, as illustrated in FIG. 5, a high power device or die 202A that may emit a relatively large amount of EMI, for example, a power amplifier, as well as a second device or die 202B that may be sensitive to EMI, for example, a low noise amplifier may be present in the same module 200. It may thus be desired to form one or more conductive posts 216 between the high power device or die 202A and the EMI sensitive device or die 202B. In some instances, the conductive posts 216 may be spaced from one another at a fraction of a wavelength of the electromagnetic radiation expected to be emitted from the high power device or die 202A. In other embodiments, the conductive posts 216, or even a single conductive post 216, may provide sufficient amount of conduction of energy emitted from the high power device or die 202A to the ground plane 212 such that multiple conductive posts 216, or conductive posts 216 spaced at a fraction of the wavelength of electromagnetic radiation of concern, may not be necessary to achieve a desired attenuation of EMI. For especially EMI sensitive devices or die 202C it may be desired to provide conductive posts 216 on each side of the device or die 202C to guard against both intra-module EMI and EMI from sources external to the module 200. For high power or sensitive devices or die 202D located proximate an edge or corner of the module 200 it may be desired to provide conductive posts only on sides of the device or die 202D facing other devices or die within the module.

In summary, an effective, low cost and robust integrated EMI shield can be provided in any transfer molded module using only the ground plane typically already present in the module substrate, a thin layer of conductive material deposited on top of the mold compound, and a plurality of the conductive posts discussed herein to connect the conductive layer to the ground plane, thereby forming a complete shield for some or all of the devices in the module. The conductive posts may be placed anywhere in the package, with optional redundant connections to ensure the contact to the conductive layer 224 meets all electrical requirements, allowing for a very flexible EMI shield design that can be easily modified to accommodate different module layouts and devices. Similarly, as discussed above with reference to FIG. 4, the vias 214 connecting the wirebond pads 210 (or track 218) to the ground plane need not be coincident with each pad, or with specific locations on the ground plane, allowing for flexible pad 210 and via 214 placement in the module. The number of conductive posts required to provide an adequate EMI shield depends on the operating frequency of the devices to be shielded and the level of shielding desired. For example, the density (the spacing between immediately adjacent conductive posts 216 in any given direction) may increase with increasing signal frequency. In one example, a spacing of about $\lambda/20$ (where $\lambda$ is the wavelength of the signal to be shielded) may be used. It is to be appreciated that the post spacing need not be uniform, provided only that the minimum spacing to achieve desired shielding at a given frequency is maintained. The conductive posts discussed herein can be used to provide a completely integrated EMI shield that is highly flexible and adds minimal cost, weight and/or size to the module. The conductive posts may be processed using traditional processing techniques which are low cost, robust and do not require the procurement of any additional or specialized assembly equipment.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A packaged semiconductor module having an integrated electromagnetic interference shield comprising:
    a substrate having a ground plane;
    an electronic device mounted on a surface of the substrate;
    a bond pad disposed on the surface of the substrate and electrically connected to the ground plane;
    a mold compound covering the electronic device;
    a conductive post disposed on a side of the electronic device, the conductive post extending from the bond pad and at least partially through the mold compound; and
    a conductive layer disposed on the mold compound and electrically coupled to the conductive post and to the ground plane, the conductive layer physically contacting the ground plane on a side of the mold compound, the conductive post, the conductive layer, and the ground plane together forming the integrated electromagnetic interference shield, the conductive post extending from the bond pad to the conductive layer in a direction perpendicular to a plane defined by the surface of the substrate.

2. The packaged semiconductor module of claim 1 wherein the conductive layer is disposed on a top and sides of the mold compound.

3. The packaged semiconductor module of claim 1 wherein the conductive layer physically contacts the conductive post on the top of the mold compound.

4. The packaged semiconductor module of claim 1 wherein the conductive layer includes silver-filled epoxy.

5. The packaged semiconductor module of claim 1 wherein the electronic device is an RF device.

6. The packaged semiconductor module of claim 1 further comprising a plurality of electronic devices mounted on the surface of the substrate and a plurality of conductive posts disposed between two of the plurality of electronic devices.

7. The packaged semiconductor module of claim 1 further comprising a plurality of electronic devices mounted on the surface of the substrate and only a single conductive post disposed between two of the plurality of electronic devices.

8. The packaged semiconductor module of claim 1 further comprising a plurality of conductive posts surrounding the electronic device.

9. The packaged semiconductor module of claim 1 further comprising a conductive via disposed within the substrate and providing electrical connection between the bond pad and the ground plane.

10. The packaged semiconductor module of claim 9 wherein the conductive via is disposed directly below the conductive post.

11. The packaged semiconductor module of claim 9 wherein the conductive via is laterally displaced from the conductive post.

12. The packaged semiconductor module of claim 1 further comprising a conductive material layer formed on sides of the mold compound and in electrical connection with the ground plane, the conductive post in electrical connection to the ground plane through the conductive layer and the conductive material layer.

* * * * *